US012573583B2

(12) United States Patent
Zhou et al.

(10) Patent No.: US 12,573,583 B2
(45) Date of Patent: Mar. 10, 2026

(54) SYSTEM OF SCANNING ELECTRON MICROSCOPE SAMPLE BOX AND METHOD OF OPENING THE SAME

(71) Applicant: University Of Science And Technology Of China, Hefei (CN)

(72) Inventors: Hongmin Zhou, Hefei (CN); Shengquan Fu, Hefei (CN); Ming Li, Hefei (CN)

(73) Assignee: University Of Science And Technology Of China, Hefei (CN)

( * ) Notice: Subject to any disclaimer, the term of this patent is extended or adjusted under 35 U.S.C. 154(b) by 432 days.

(21) Appl. No.: 18/257,213

(22) PCT Filed: Jan. 29, 2021

(86) PCT No.: PCT/CN2021/074369
§ 371 (c)(1),
(2) Date: Jun. 13, 2023

(87) PCT Pub. No.: WO2022/126840
PCT Pub. Date: Jun. 23, 2022

(65) Prior Publication Data
US 2024/0014001 A1      Jan. 11, 2024

(30) Foreign Application Priority Data
Dec. 14, 2020     (CN) .......................... 202011467897.0

(51) Int. Cl.
*H01J 37/20*          (2006.01)
*H01J 37/28*          (2006.01)

(52) U.S. Cl.
CPC .............. *H01J 37/20* (2013.01); *H01J 37/28* (2013.01); *H01J 2237/204* (2013.01)

(58) Field of Classification Search
CPC ...... H01J 37/20; H01J 37/28; H01J 2237/204; H01J 2237/26; G01N 23/22
See application file for complete search history.

(56) References Cited

U.S. PATENT DOCUMENTS

| | | | |
|---|---|---|---|
| 6,444,982 B1 * | 9/2002 | Mitchell ................. | H01J 37/20 250/311 |
| 2011/0133093 A1 * | 6/2011 | Jagannathan ............ | G21K 4/00 250/366 |
| 2013/0193343 A1 | 8/2013 | Nagakubo et al. | |

FOREIGN PATENT DOCUMENTS

| | | |
|---|---|---|
| CN | 1238552 A | 12/1999 |
| CN | 101570853 A | 11/2009 |

(Continued)

OTHER PUBLICATIONS

"Chinese Application Serial No. 202011467897.0, Office Action dated Apr. 29, 2022", (Apr. 29, 2022), 6 pgs.

(Continued)

*Primary Examiner* — Robert H Kim
(74) *Attorney, Agent, or Firm* — Schwegman Lundberg & Woessner, P.A.

(57)          ABSTRACT

A system of scanning electron microscope sample box and a method of opening the same are provided, including: a sample chamber (1); an exchange chamber (2) communicated with the sample chamber (1), a sample stage base (3) is disposed in the exchange chamber (2), the sample stage base (3) is subjected to an external force to be translated from the exchange chamber (2) to the sample chamber (1), and an inner wall of the exchange chamber (2) is provided with a pulling arm (4); and a sample box including a box body (5) and a box cover (6) sealing the box body (5), wherein the box body (5) is placed on the sample stage base (3) of the exchange chamber (2), and the box cover (6) is connected to the pulling arm (4), so that the box body (5) is (Continued)

separated from the box cover (6) when the sample stage base (3) is subjected to the external force to translate the box body (5) from the exchange chamber (2) to the sample chamber (1). The method of opening the scanning electron microscope sample box provided by the present disclosure is simple and is easy for implementation, reducing a difficulty and a cost of a process of manufacturing the sample box.

11 Claims, 4 Drawing Sheets

(56) References Cited

FOREIGN PATENT DOCUMENTS

| | | | |
|---|---|---|---|
| CN | 102514810 | A | 6/2012 |
| CN | 202529297 | U | 11/2012 |
| CN | 103155089 | A | 6/2013 |
| CN | 105340841 | A | 2/2016 |
| CN | 205588187 | U | 9/2016 |
| CN | 106290431 | A | 1/2017 |
| CN | 211214404 | U | 8/2020 |
| CN | 213042869 | U | 4/2021 |
| JP | 0298351 | A | 4/1990 |
| JP | 2001153760 | A | 6/2001 |

OTHER PUBLICATIONS

"Chinese Application Serial No. 202011467897.0, Office Action dated Sep. 26, 2021", w/ English Translation, (Sep. 26, 2021), 19 pgs.

"International Application Serial No. PCT/CN2021/074369, International Search Report dated Sep. 9, 2021", (Sep. 9, 2021), 3 pgs.

"International Application Serial No. PCT/CN2021/074369, Written Opinion dated Sep. 9, 2021", (Sep. 9, 2021), 5 pgs.

* cited by examiner

6

5

4

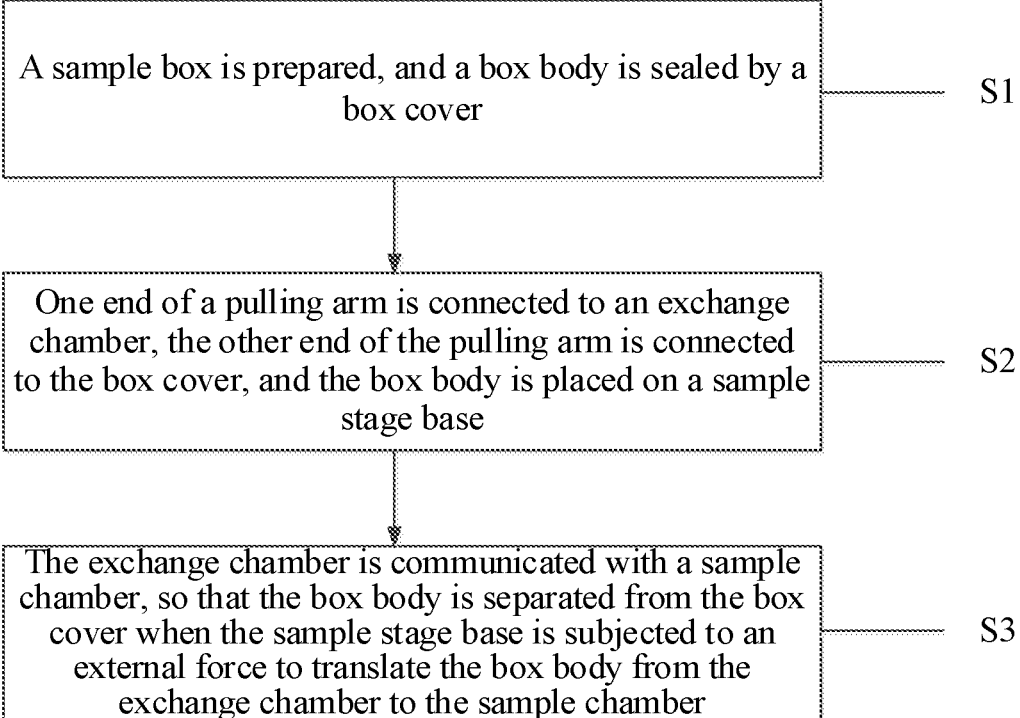

A sample box is prepared, and a box body is sealed by a box cover S1

One end of a pulling arm is connected to an exchange chamber, the other end of the pulling arm is connected to the box cover, and the box body is placed on a sample stage base S2

The exchange chamber is communicated with a sample chamber, so that the box body is separated from the box cover when the sample stage base is subjected to an external force to translate the box body from the exchange chamber to the sample chamber S3

FIG. 4

SYSTEM OF SCANNING ELECTRON MICROSCOPE SAMPLE BOX AND METHOD OF OPENING THE SAME

PRIORITY APPLICATIONS

This application is a U.S. National Stage Filing under 35 U.S.C. § 371 from International Application No. PCT/CN2021/074369, filed on Jan. 29, 2021, and published as WO2022/126840 on Jun. 23, 2022, which claims the benefit of priority to Chinese Application No. 202011467897.0, filed on Dec. 14, 2020; the benefit of priority of each of which is hereby claimed herein, and which applications and publication are hereby incorporated herein by reference in their entireties.

TECHNICAL FIELD

The present disclosure relates to the field of scanning electron microscope technology, and in particular to a system of scanning electron microscope sample box that insulates a sample from air injection and a method of opening the same.

BACKGROUND

The scanning electron microscope is a commonly used apparatus for analyzing a morphology and composition of a material sample. A morphological observation is achieved through secondary electron imaging, and a sample characteristic X ray is excited for a sample composition analysis by secondary electrons. Due to a requirement of a certain degree of vacuum for electron generation and propagation, a scanning electron microscope sample test requires to be performed under a certain vacuum condition and the sample has no obstruction. For a scanning electron microscope equipped with a sample exchange chamber, the sample exchange chamber is opened first and a sample is placed, then the exchange chamber is vacuumized; a channel valve between the exchange chamber and a sample chamber is opened after the exchange chamber reaches a certain vacuum degree, the sample is pushed into the sample chamber at a certain vacuum degree through a channel; and a detecting operation is performed hereafter. Some materials, due to their own chemical or physical properties, are prone to generate a chemical reaction with oxygen or water in the air or absorb water in the air, so that true information of the material may not be acquired. Therefore, it is required to isolate the material from the air by a sample box with gas protection or maintaining a vacuum degree, and the material is sent into the scanning electron microscope, and the sample box is opened in a scanning electron microscope chamber under a closed vacuum condition for testing. At present, a method of opening the sample box on the market is mainly electrical driven or pressure driven, of which a cost is high. The sample box system of the present disclosure uses the exchange chamber equipped in the scanning electron microscope to open the sample box in a simple and feasible way, so as to reduce a difficulty of a process of manufacturing the sample box and a cost of manufacturing.

SUMMARY

(1) Technical Problems to be Addressed

For the above problems, the present disclosure provides a system of a scanning electron microscope sample box that insulates a sample from air injection and a method of opening the same, which is used to at least partially solve the technical problems such as high cost and great difficulty of the process of the traditional method of opening the sample box.

(2) Technical Solution

In an aspect of the present disclosure, a system of a scanning electron microscope sample box is provided, including: a sample chamber 1; an exchange chamber 2 communicated with the sample chamber 1, wherein a sample stage base 3 is disposed in the exchange chamber 2, the sample stage base 3 is subjected to an external force to be translated from the exchange chamber 2 to the sample chamber 1, and an inner wall of the exchange chamber 2 is provided with a pulling arm 4; and a sample box including a box body 5 and a box cover 6 sealing the box body 5, wherein the box body 5 is placed on the sample stage base 3 of the exchange chamber 2, and the box cover 6 is connected to the pulling arm 4, so that the box body 5 is separated from the box cover 6 when the sample stage base 3 is subjected to the external force to translate the box body 5 from the exchange chamber 2 to the sample chamber 1.

Further, the sample stage base 3 includes a sample rod for translating the box body 5 of the sample box from the exchange chamber 2 to the sample chamber 1.

Further, a connection between the exchange chamber 2 and the pulling arm 4 includes a fixed connection or a detachable connection.

Further, a connection between the box cover 6 and the pulling arm 4 includes a fixed connection or a detachable connection.

Further, the detachable connection includes an adhesive connection, a bolt connection, a buckle connection or a slot connection.

In another aspect of the present disclosure, a method of opening a scanning electron microscope sample box is provided, including: S1, preparing a sample box and sealing a box body 5 by a box cover 6; S2, connecting one end of a pulling arm 4 to an exchange chamber 2, connecting the other end of the pulling arm 4 to the box cover 6, and placing the box body 5 on a sample stage base 3; and S3, communicating the exchange chamber 2 with a sample chamber 1, so that the box body 5 is separated from the box cover 6 when the sample stage base 3 is subjected to an external force to translate the box body 5 from the exchange chamber 2 to the sample chamber 1.

Further, before S3, the method further includes: vacuumizing the exchange chamber 2.

Further, a manner of the box cover 6 sealing the box body 5 in S1 is an adhesive sealing.

Further, a manner of connecting one end of the pulling arm 4 to the exchange chamber 2 in S2 includes a fixed connection or a detachable connection.

Further, the sample stage base 3 being subjected to the external force in S3 specifically includes: translating the box body 5 from the exchange chamber 2 to the sample chamber 1 by pushing a sample rod of the sample stage base 3.

(3) Beneficial Effects

Embodiments of the present disclosure provide a system of a scanning electron microscope sample box that insulates the sample from air injection and a method of opening the same, which uses the exchange chamber equipped in an instrument to achieve opening the sample box under a closed and vacuum condition within the scanning electron microscope through a simple and easy way of the pulling arm. Compared with the existing sample box or the sample vacuum transmission system on the market which is electrical driven or opened under pressure, such opening method is simple and easy for implementation, reducing the difficulty and the cost of the process of manufacturing the sample box.

BRIEF DESCRIPTION OF THE DRAWINGS

FIG. 4 schematically shows a flowchart of a method of opening a scanning electron microscope sample box according to an embodiment of the present disclosure.

REFERENCE NUMERALS

1. Sample chamber;
2. Exchange chamber;
3 Sample stage base;
4 Pulling arm;
5 Box body;
6 Box cover.

DETAILED DESCRIPTION OF EMBODIMENTS

In order to make objectives, technical solutions, and advantages of the present disclosure clearer, the present disclosure will be further described in detail below in combination with the specific embodiments and with reference to the accompanying drawings.

Figure 1:
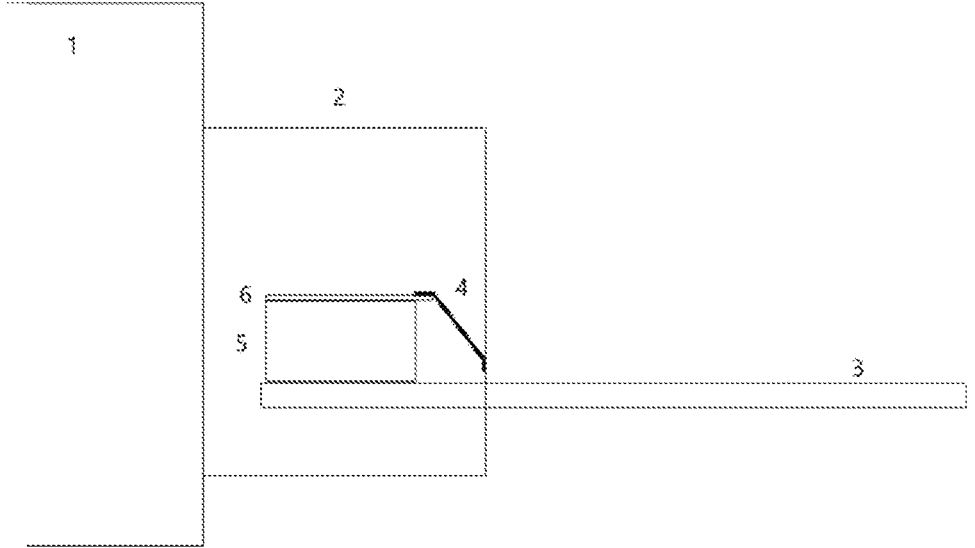
FIG. 1 schematically shows a structural diagram of a system of a scanning electron microscope sample box according to an embodiment of the present disclosure.

The embodiment of the present disclosure provides a system of a scanning electron microscope sample box which, as shown in FIG. 1, includes: a sample chamber 1; an exchange chamber 2 which may be connected to sample chamber 1, wherein a sample stage base 3 is disposed in the exchange chamber 2, the sample stage base 3 may be subjected to an external force to be translated from the exchange chamber 2 to the sample chamber 1, and an inner wall of the exchange chamber 2 is further provided with a pulling arm 4; and a sample box including a box body 5 and a box cover 6 sealing the box body 5, wherein the box body 5 is placed on the sample stage base 3 of the exchange chamber 2, and the box cover 6 is connected to the pulling arm 4, so that the box body 5 is separated from the box cover 6 when the sample stage base 3 is subjected to the external force to translate the box body 5 from the exchange chamber 2 to the sample chamber 1.

The scanning electron microscope is designed for a sample box that isolates a sample from air through vacuumizing or gas protection. After the sample box is mounted in the exchange chamber 2 of the scanning electron microscope, one end of the pulling arm 4 is connected to the sample box cover 6 and the other end of the pulling arm 4 is connected to a chamber body of the exchange chamber 2 of the scanning electron microscope. After the exchange chamber 2 reaches a certain vacuum degree, the sample box is pushed into the sample chamber 1 from the exchange chamber 2. In this process, the box cover of the sample box is gradually pulled apart by the pulling arm 4 to be separate from the box body 5, so as to achieve opening the sample box under a condition of air isolation in the scanning electron microscope.

On a basis of the above embodiment, the sample stage base 3 includes a sample rod for translating the box body 5 of the sample box from the exchange chamber 2 to the sample chamber 1.

After sample exchange chamber reaches a vacuum degree, a valve between the sample exchange chamber 2 and the sample chamber 1 is opened, the sample rod of the sample stage base 3 is used to push the sample box into the sample chamber, in which the sample rod connected to the sample stage base 3 is used for pushing.

On a basis of the above embodiment, a connection between the exchange chamber 2 and the pulling arm 4 includes a fixed connection or a detachable connection.

Figure 2:
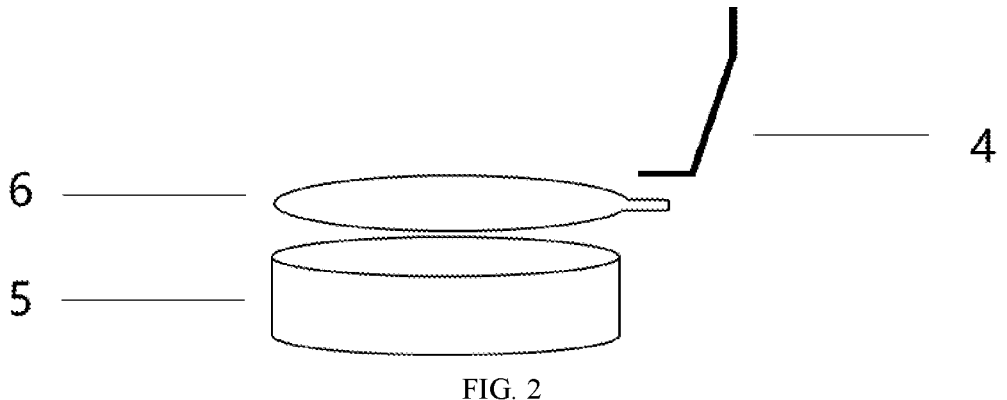
FIG. 2 schematically shows a structural diagram of a sample box and a pulling arm according to an embodiment of the present disclosure.

One end of the pulling arm 4 may be directly connected to the exchange chamber through pasting or fixing by a screw, or indirectly connected to the exchange chamber through other accessories, which may be a fixed connection or a detachable connection. A material of the pulling arm is not limited, and it has a certain tensile strength with a length of between 5 mm and 500 mm. By taking a circular sample box as an example, a schematic diagram of the sample box and the pulling arm 4 is shown in FIG. 2.

On a basis of the above embodiment, a connection between the box cover 6 and the pulling arm 4 includes a fixed connection or a detachable connection.

The other end of the pulling arm 4 may be processed into an integral part with the box cover, or may be connected to the box cover through pasting or other methods, which may be a fixed connection or a detachable connection, however, the pulling arm 4 may not be fixedly connected to the exchange chamber 2 and the box cover 6 at the same time.

On a basis of the above embodiment, the detachable connection includes an adhesive connection, a bolt connection, a buckle connection or a slot connection.

The adhesive connection has advantages of simplicity and easy implementation. The bolt connection has advantages of stability and non-looseness. The connection between the pulling arm 4 and the exchange chamber 2 as well as the box cover 6 may be selected as desired, which is flexible and simple.

Another embodiment of the present disclosure provides a method of opening a scanning electron microscope sample box, as shown in FIG. 4, including: S1, a sample box is prepared and a box body 5 is sealed by a box cover 6; S2, one end of a pulling arm 4 is connected to an exchange chamber 2, the other end of the pulling arm 4 is connected to the box cover 6, and the box body 5 is placed on a sample stage base 3; S3, the exchange chamber 2 is communicated with a sample chamber 1, so that the box body 5 is separated from the box cover 6 when the sample stage base 3 is subjected to an external force to translate the box body 5 from the exchange chamber 2 to the sample chamber 1.

According to characteristics of the sample, nitrogen or other protective gas is selected in a glove box or similar environment that may provide gas protection. According to a requirement of fixing the sample for the scanning electron microscope, the sample to be tested is fixed in the sample box. An opening of the box is sealed by the box cover 6. The sample box is taken out from the glove box or a protective environment. The exchange chamber 2 of the scanning electron microscope is opened and the sample box is mounted on the sample stage base 3 of the exchange chamber 2. The pulling arm 4 is connected to the box cover 6 (this connection may be omitted if the box cover has been processed into an integral part with the pulling arm). The other end of the pulling arm 4 is connected to the exchange chamber 2 and the exchange chamber is closed. The exchange chamber is vacuumized, and when the vacuum degree reaches, a channel valve between the exchange chamber 2 and the sample chamber 1 is opened, and the sample box is pushed into the sample chamber of the scanning electron microscope. The following steps are performed according to the testing steps of the scanning electron microscope.

On a basis of the above embodiment, before S3, vacuuming the exchange chamber 2 is included.

Figure 3:
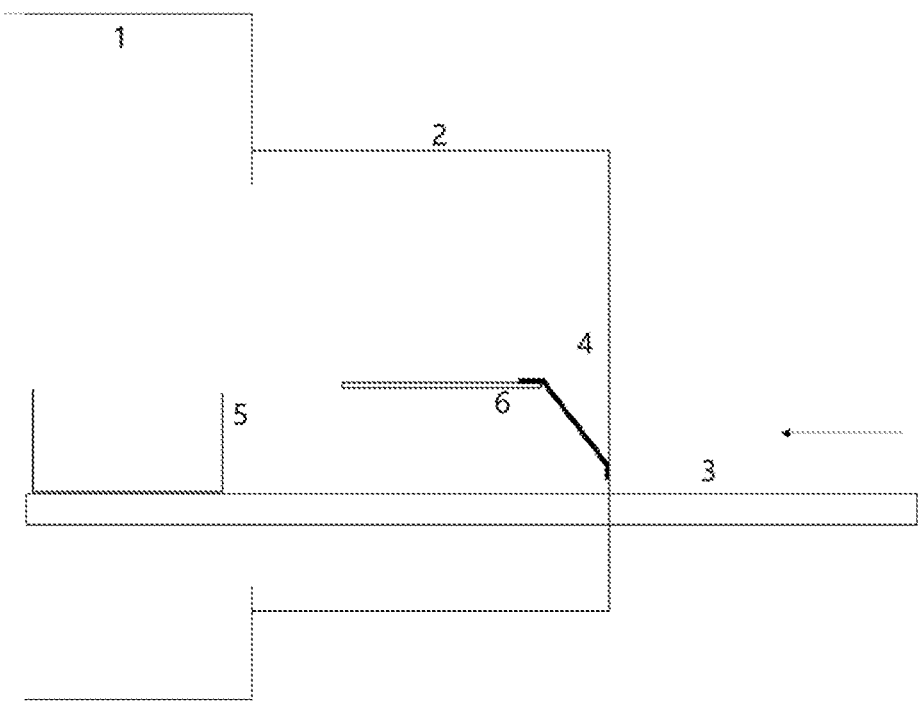
FIG. 3 schematically shows a flowchart of a sample box being pulled apart by a pulling arm in a process of pushing the sample box into a sample chamber of an electron microscope according to an embodiment of the present disclosure.

After the vacuum degree of the sample exchange chamber 2 is reached, the channel valve between the sample exchange chamber 2 and the sample chamber 1 of the scanning electron microscope is opened, and the sample box is pushed into the sample chamber 1 of the scanning electron microscope. During this process of pushing, the box cover of the sample box is gradually pulled apart by the pulling arm until it is completely separated from the box body, as shown in FIG. 3.

On a basis of the above embodiment, a manner of the box cover 6 sealing the box body 5 in S1 is the adhesive sealing.

The sample is placed into the glove box protected by nitrogen, and the box cover is sealed by adhesive. The Sealing adhesive has advantages of simplicity and easy operation.

On a basis of the above embodiment, a manner of connecting one end of the pulling arm 4 to the exchange chamber 2 in S2 includes the fixed connection or the detachable connection.

The sample box containing the sample is mounted on the sample stage base 3 of the sample exchange chamber 2, and two ends of the pulling arm 4 are respectively connected to the box cover 6 and the exchange chamber 2. The connection may be the fixed connection or the detachable connection, but the pulling arm 4 may not be fixedly connected to the exchange chamber 2 and the box cover 6 at the same time.

On a basis of the above embodiment, the sample stage base 3 being subjected to the external force in S3 specifically includes that: the box body 5 is translated from the exchange chamber 2 to the sample chamber 1 by pushing the sample rod of the sample stage base 3.

The sample rod of the sample stage base 3 is used to push the sample box into the sample chamber. During the process of pushing, the box cover of the sample box is gradually pulled apart by the pulling arm until the box cover is completely separated from the box body.

The present disclosure will be described in detail below by using a specific embodiment.

The box body 5 is a circular aluminum box with a diameter of 38 mm, a wall thickness of 1 mm, and a height of 6 mm. The box cover 6 is made of acrylic material with a thickness of 2 mm, a diameter of 40 mm, a 5 mm protruding edge with screw holes, and a side of the box cover has adhesive. The pulling arm 4 is a stainless steel sheet with a thickness of 0.5 mm, a width of 5 mm, and a length of 80 mm. There are holes at two ends of the pulling arm for screws to pass through.

The sample is placed in a glove box protected by nitrogen and the box cover is sealed by adhesive. This test was performed on the GeminiSEM 500 scanning electron microscope of Zeiss in Germany.

The sample box containing the sample is mounted on the sample stage base 3 of the sample exchange chamber 2. One end of the pulling arm 4 is fixed to the box cover 6 through a screw. The existing screws in the exchange chamber 2 which are used to fix the position of the base 3 are used to fixedly connect the other end of the pulling arm 4 to the exchange chamber 2.

After the vacuum degree of the sample exchange chamber is reached, the valve between the sample exchange chamber 2 and the sample chamber 1 is opened, and the sample rod of the sample stage base 3 is used to push the sample box into the sample chamber. From a CCD camera of the sample chamber, it may be seen that the box cover of the sample box has been completely separated, achieving the expected effect.

The specific embodiments mentioned above have further explained the objectives, technical solutions, and beneficial effects of the present disclosure. It should be understood that the above are only the specific embodiments of the present disclosure and are not intended to limit it. Any modifications, equivalent replacements, improvements, etc. made within the spirit and principle of the present disclosure should be included in the scope of protection of the present disclosure.

What is claimed is:

1. A system of a scanning electron microscope sample box, comprising:
   a sample chamber;
   an exchange chamber communicated with the sample chamber, wherein a sample stage base is disposed in the exchange chamber, the sample stage base is subjected to an external force to be translated from the exchange chamber to the sample chamber, and an inner wall of the exchange chamber is provided with a pulling arm; and
   a sample box comprising a box body and a box cover sealing the box body, wherein the box body is placed on the sample stage base of the exchange chamber, and the box cover is connected to the pulling arm, so that the box body is separated from the box cover when the sample stage base is subjected to the external force to translate the box body from the exchange chamber to the sample chamber.

2. The system of the scanning electron microscope sample box of claim 1, wherein the sample stage base comprises a sample rod for translating the box body of the sample box from the exchange chamber to the sample chamber.

3. The system of the scanning electron microscope sample box of claim 1, wherein a connection between the exchange chamber and the pulling arm comprises a fixed connection or a detachable connection.

4. The system of the scanning electron microscope sample box of claim 1, wherein a connection between the box cover and the pulling arm comprises a fixed connection or a detachable connection.

5. The system of the scanning electron microscope sample box of claim 3, wherein the detachable connection comprises an adhesive connection, a bolt connection, a buckle connection or a slot connection.

6. A method of opening a scanning electron microscope sample box, comprising:
   S1, preparing a sample box and sealing a box body by a box cover;
   S2, connecting one end of a pulling arm to an exchange chamber, connecting the other end of the pulling arm to the box cover, and placing the box body on a sample stage base; and S3, communicating the exchange chamber with a sample chamber, so that the box body is separated from the box cover when the sample stage base is subjected to an external force to translate the box body from the exchange chamber to the sample chamber.

7. The method of claim 6, wherein before S3, the method further comprises:

vacuumizing the exchange chamber.

8. The method of claim 6, wherein a manner of the box cover sealing the box body in S1 is an adhesive sealing.

9. The method of claim 6, wherein a manner of connecting one end of the pulling arm to the exchange chamber in S2 comprises a fixed connection or a detachable connection.

10. The method of claim 9, wherein the sample stage base being subjected to the external force in S3 specifically comprises: translating the box body from the exchange chamber to the sample chamber by pushing a sample rod of the sample stage base.

11. The system of the scanning electron microscope sample box of claim 4, wherein the detachable connection comprises an adhesive connection, a bolt connection, a buckle connection or a slot connection.

*　*　*　*　*